United States Patent
Xie et al.

(10) Patent No.: US 8,952,823 B2
(45) Date of Patent: Feb. 10, 2015

(54) BATTERY EARLY WARNING AND MONITORING SYSTEM

(75) Inventors: Jian Xie, Carmel, IN (US); Jie Chen, Carmel, IN (US)

(73) Assignee: Indiana University Research and Technology Corporation, Indianapolis, IN (US)

( * ) Notice: Subject to any disclaimer, the term of this patent is extended or adjusted under 35 U.S.C. 154(b) by 404 days.

(21) Appl. No.: 13/355,320

(22) Filed: Jan. 20, 2012

(65) Prior Publication Data

US 2012/0188086 A1 Jul. 26, 2012

Related U.S. Application Data

(60) Provisional application No. 61/434,697, filed on Jan. 20, 2011.

(51) Int. Cl.
- G08B 21/00 (2006.01)
- G01R 31/36 (2006.01)
- B60Q 1/00 (2006.01)
- G01N 27/416 (2006.01)
- G01R 31/04 (2006.01)
- H02J 7/04 (2006.01)
- H02J 7/00 (2006.01)

(52) U.S. Cl.
CPC ........ *G01R 31/3606* (2013.01); *G01R 31/3651* (2013.01); *G01R 31/3675* (2013.01)

USPC ................ 340/636.18; 340/636.11; 340/455; 324/433; 324/538; 320/162; 320/109

(58) Field of Classification Search
CPC ............... H01M 10/48; H01M 10/486; G01R 31/3662; G01R 31/3648; Y02T 10/705; Y02T 10/1005; Y02T 10/7088
USPC ...................... 340/636.18, 455; 324/433, 538
See application file for complete search history.

(56) References Cited

U.S. PATENT DOCUMENTS

| | | | |
|---|---|---|---|
| 2009/0085527 A1* | 4/2009 | Odaohhara | 320/150 |
| 2009/0322340 A1* | 12/2009 | Zhang et al. | 324/433 |
| 2010/0327810 A1* | 12/2010 | Jimbo et al. | 320/126 |
| 2012/0025842 A1* | 2/2012 | Gibbs et al. | 324/538 |

* cited by examiner

*Primary Examiner* — Jack K Wang
(74) *Attorney, Agent, or Firm* — Barnes & Thornburg LLP

(57) ABSTRACT

An early warning and monitoring system is disclosed for battery cells and battery packs. During normal cycling of a battery, surface temperature, voltage, current and impedance may be monitored to determine if abnormalities exist in the battery and/or battery structure. The abnormalities may be advantageously detected using battery temperature characteristics, where the characteristics are subject to rule-based processing to determine impending battery failure. By receiving advance notice of failure, a warning signal may be transmitted to provide notice and/or allow corrective action to be taken.

7 Claims, 9 Drawing Sheets

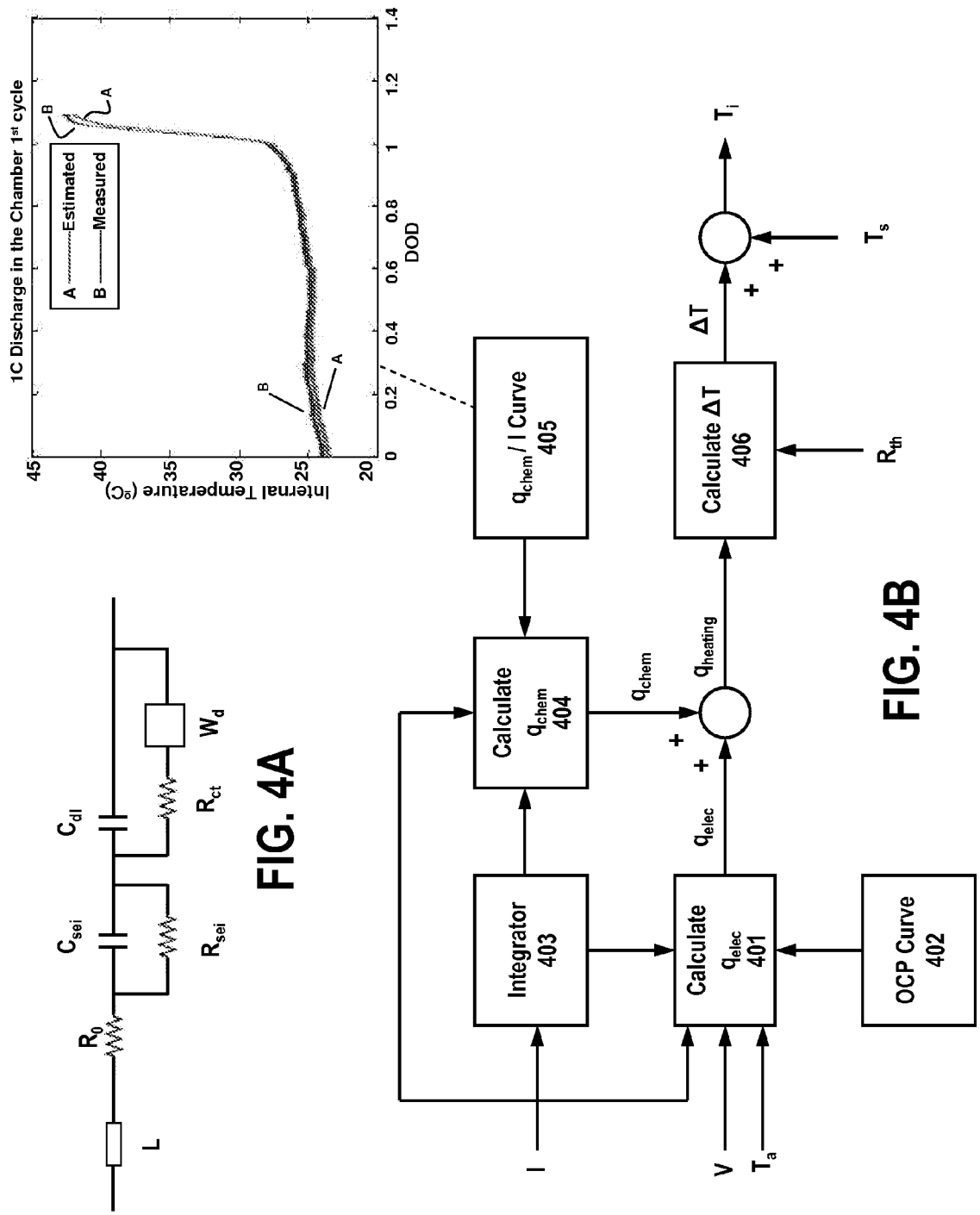

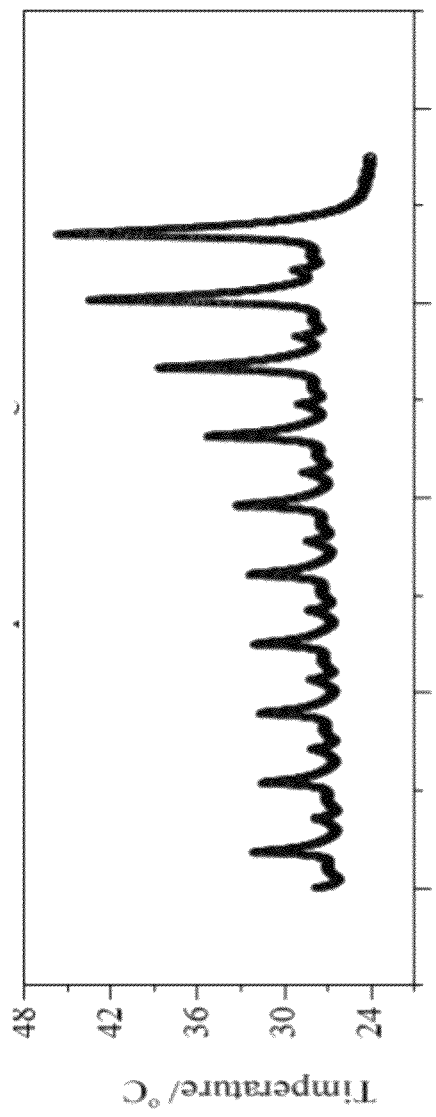
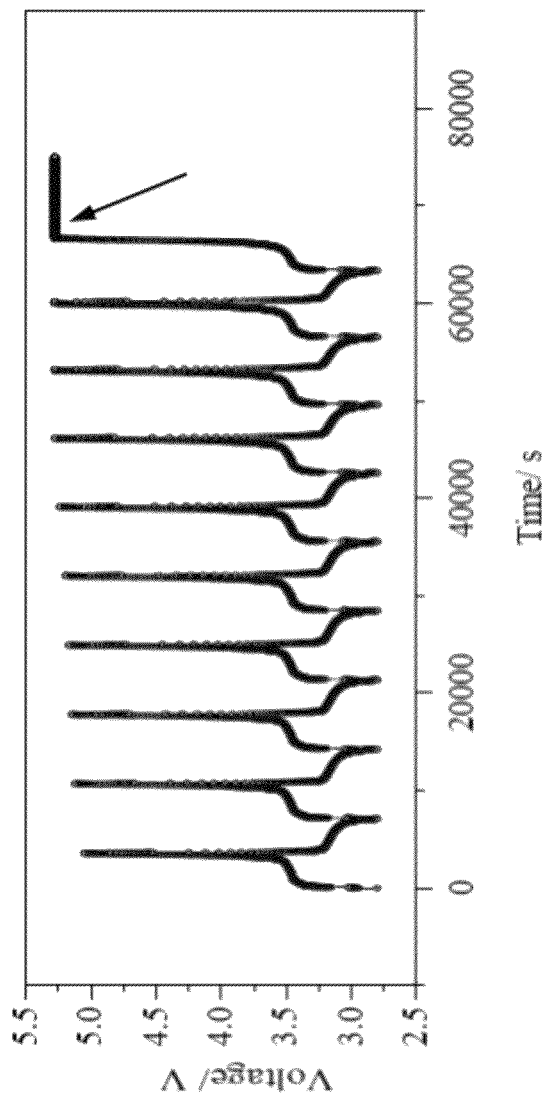
FIG. 5A
FIG. 5B

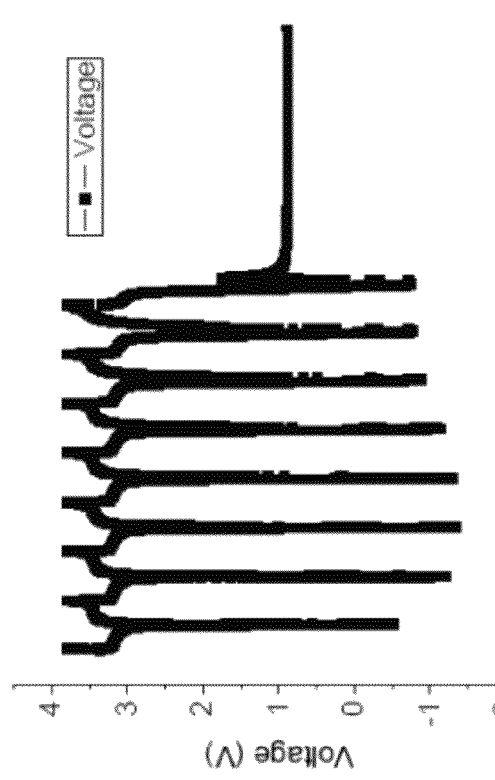
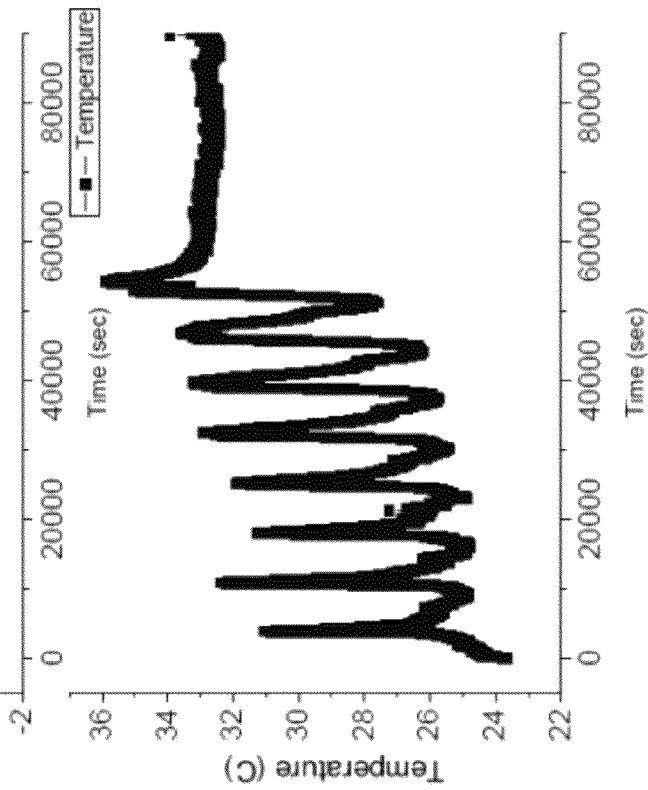
FIG. 5C
FIG. 5D

US 8,952,823 B2

BATTERY EARLY WARNING AND MONITORING SYSTEM

RELATED APPLICATIONS

This application claims priority to U.S. provisional patent application No. 61/434,697 filed Jan. 20, 2011, titled "Battery Early Warning and Monitoring System," the contents of which is incorporated by reference in its entirety herein.

GOVERNMENT RIGHTS

This invention was made with government support under grant number N00164-09-C-GS42 awarded by NSWC Crane Department of Defense. The U.S. Government has certain rights in the invention.

TECHNICAL FIELD

The present disclosure is directed to battery monitoring and notification. More specifically, the present disclosure is directed to monitoring of one or more battery conditions and communicating a warning signal when a failure condition is present.

BACKGROUND INFORMATION

Battery-powered electronic devices have become ubiquitous in modern society. The recent rapid expansion of the use of portable devices, electrically powered motors and the like has created a strong demand for fast deployment of battery technologies. The design of a battery-powered device requires many battery-management features, including charge control, battery-capacity monitoring, remaining run-time information, charge-cycle counting, and so on. Generally speaking, the basic task of a Battery Management System (BMS) is to ensure that optimum use is made of the energy inside the battery powering the portable product and that the risk of damage to the battery or surrounding circuitry is prevented. This may be achieved by monitoring and controlling the battery's charging and discharging process. One area where improvements are needed is in the area of battery failure detection. More specifically, there is a need to determine battery failure in advance of an actual failure.

SUMMARY

Accordingly, apparatuses, systems and methods are disclosed for an early warning and monitoring configuration for battery cells and battery packs. During normal cycling of a battery, surface temperature, voltage, current and impedance may be monitored to determine if abnormalities exist in the battery and/or battery structure. The abnormalities may be advantageously detected using battery temperature characteristics, where the characteristics are subject to rule-based processing to determine impending battery failure. By receiving advance notice of failure, a warning signal may be transmitted to provide notice and/or allow corrective action to be taken. Additional characteristics, such as voltage and/or current may be used in conjunction with the temperature to detects and/or predict failure. Additional information is provided in the Detailed Description, found below.

BRIEF DESCRIPTION OF THE DRAWINGS

The present invention is illustrated by way of example and not limitation in the figures of the accompanying drawings, in which like references indicate similar elements and in which:

FIG. 4A illustrates an exemplary thermal circuit used for detecting and/or predicting a battery failure condition;

FIG. 4B illustrates an exemplary process for determining a thermal model for use in detecting and/or predicting a battery failure condition;

FIGS. 5A-B are exemplary graphs illustrating temperature and voltage characteristics in a battery over-charge condition;

FIG. 5C-5D are exemplary graphs illustrating temperature and voltage characteristics in a battery over-discharge condition.

DETAILED DESCRIPTION

Figure 1:
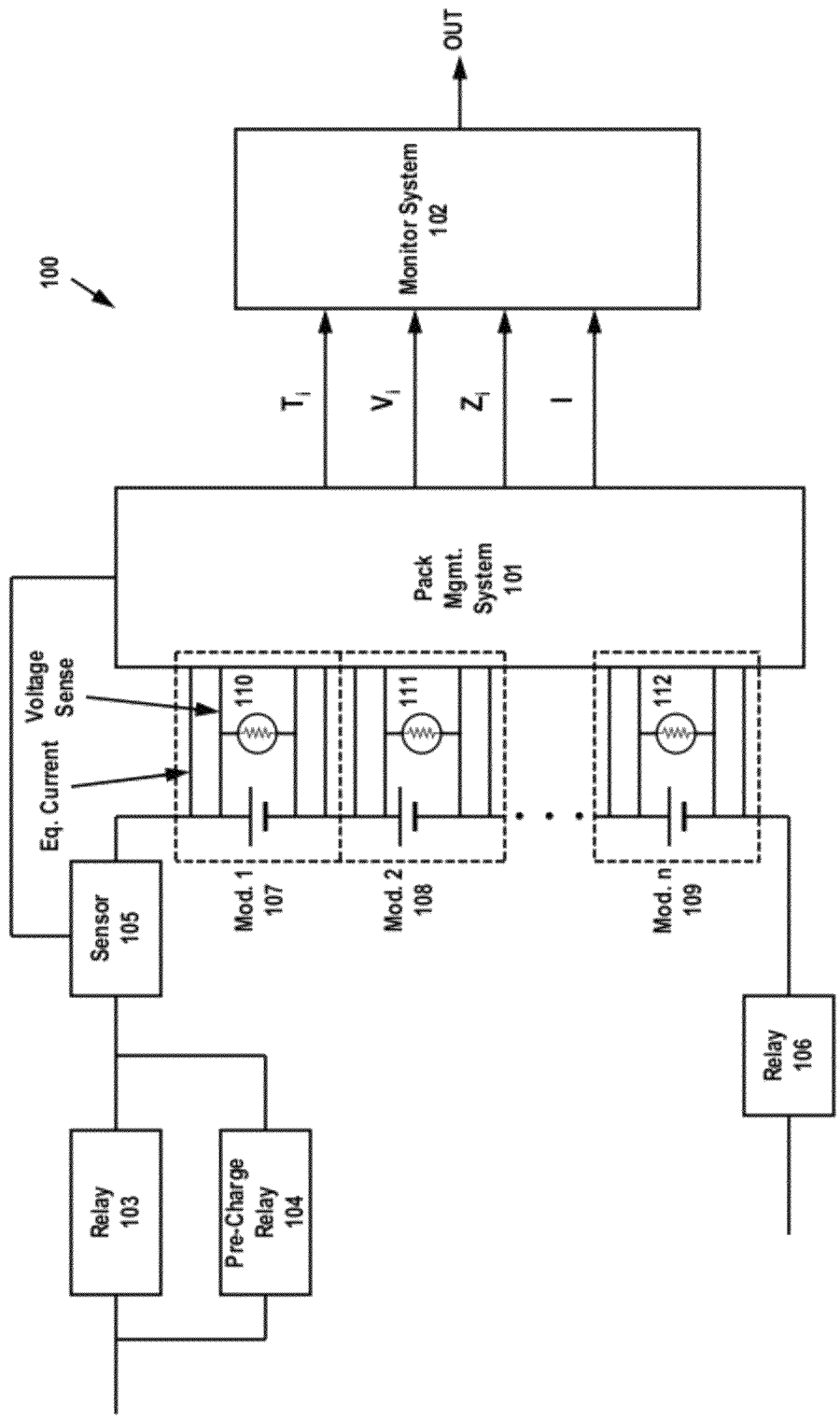
FIG. 1 illustrates an exemplary architecture for detecting battery operating conditions and processing the conditions to calculate and/or predict a failure condition in at least one of a plurality of batteries under an exemplary embodiment.

FIG. 1 illustrates an exemplary embodiment of a system 100 for detecting battery operating conditions and processing the conditions to calculate and/or predict a failure condition in at least one of a plurality of batteries. Under certain conditions, relays may be necessary to control voltage and current being delivered to the batteries. As illustrated in FIG. 1, relays 103 and 106 may be used to control the input of voltage to battery modules 107-109, along with pre-charge relay 104. When initially connecting a battery, there may be an inrush of current as the load is charged up to the battery voltage. With large batteries (with a low source resistance) and powerful loads, the inrush current can easily peak to dangerous levels. Pre-charge relay 104 (or an equivalent circuit) can limit the inrush current without necessarily limiting the operating current.

In addition to relays 103-104 and 106, a sensor 105 may be used to detect incoming current, and to provide the sensed current to pack management system (PMS) 101. In one embodiment, sensor 105 is a Hall Effect sensor capable of producing a voltage difference across an electrical conductor, transverse to an electric current in the conductor and a magnetic field perpendicular to the current. As will be apparent from the disclosure below, use of relays 103-104, 106 and sensor 105 is optional and is not critical to the present disclosure.

As is illustrated in FIG. 1, a plurality of battery modules 107-109 are operatively coupled to pack management system 101. Each battery module 107-109 is preferably coupled with a set of equalization current lines and a set of voltage sense lines, where a thermostat (110-112) is connected across each voltage sense line, shown in FIG. 1, for temperature-measurement purposes. Each battery module 107-109 (or "cell") is indexed to provide individual measurements to PMS 101 that are forwarded individually to monitor system 102. Exemplary measurements include internal battery temperature $T_i$, battery voltage $V_i$, impedance $Z_i$ and current I. Monitor system 102 processes these measurements and provides and output (OUT) which may be utilized to determine a state-of-health (SoH) or warning of a failure condition.

Figure 2:
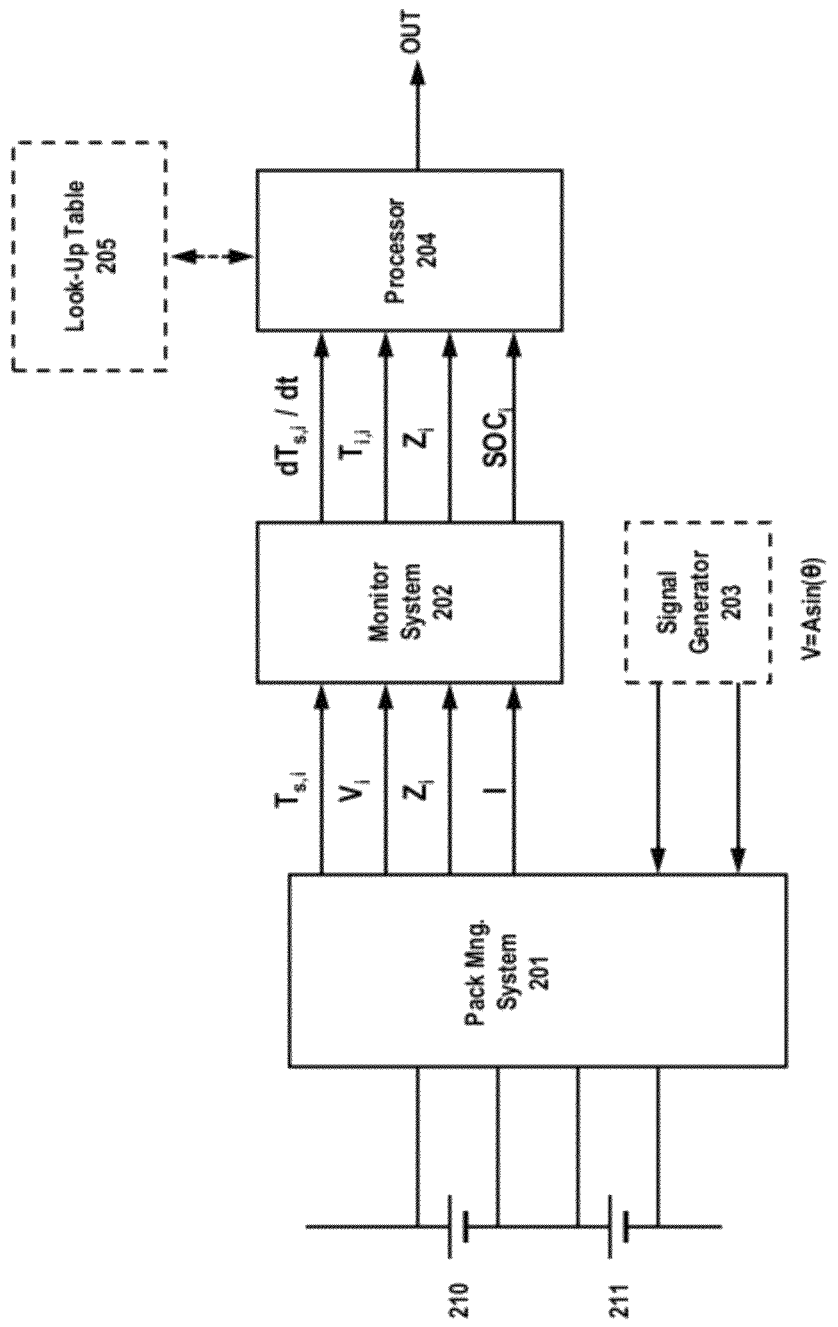
FIG. 2 illustrates another exemplary architecture for detecting battery operating conditions and processing the conditions to calculate and/or predict a failure condition in at least one of a plurality of batteries under an exemplary embodiment.

Turning to FIG. 2 another exemplary system is illustrated, where PMS 201 and monitor system 202 may be similar to that illustrated in FIG. 1. Here, measurements from each of a plurality of battery cells 210, 211 are provided to PMS 201, where PMS outputs measurements that include, for each cell i, skin temperature ($T_{s,i}$), battery voltage $V_i$, impedance $Z_i$ and current I. In one embodiment, impedance may be measure using a signal provided by signal generator 203, where the signal may be a sine wave with a voltage amplitude of ≤5 mV at different frequencies. In other embodiments, signal generator 203 is not used, and impedance is calculated in monitoring system 202 from the other measurements provided by PMS 201, discussed in greater detail below. After receiving $T_{s,i}$, $V_i$, I, and alternately $Z_i$, from PMS 201, monitor system 202 processes these inputs to determine, for each cell i, a temperature differential ($dT_{s,i}/dt$), an internal temperature ($T_{i,i}$) impedance ($Z_i$), and a state-of-charge ($SOC_i$). Generally speaking the state-of-charge may be defined by $$SOCi = \int_{t=0}^{t=t} I\,dt$$

and wherein internal temperature may be defined as $T_i = T_s + \Delta T$. Internal temperature for each cell ($T_{i,i}$) may be used to define rules for determining a failure condition, where the temperature is based on a number of characteristics including decomposition temperatures of a battery electrolyte ($T_e$), anode ($T_A$), cathode ($T_C$), separator ($T_S$) and/or solid-electrolyte interphase (SEI) ($T_{SEI}$). These and other factors have been found to be highly indicative of pending and/or actual fail conditions. Battery failure under normal cycling conditions can be tied to over-charge or over-discharge due to capacity in the balance. It has been observed that the structural changes of anode and cathode materials and decomposition of the electrolyte under normal cycling conditions contribute significantly to battery failure and are linked to temperature.

Turning briefly to FIGS. 5A-B, an exemplary graph is provided, illustrating the relationship of voltage (V) and temperature (T) during an over-charge condition for a (LiFePO4) battery. Here, a 10% overcharge and 110% SoC resulted in a relatively quick battery failure, where failure was observed after 8-10 cycles. Typically, for a given battery pack, cells above 95% are seen as experiencing overcharge, while cells below 95% are seen as experiencing over-discharge. As can be seen from FIGS. 5A and 5B, the battery voltage starts to increase slightly over time until failure (indicated by arrow in FIG. 5B). However, the temperature increases by a much greater degree (FIG. 5A) until failure ultimately occurs. During overcharge, it has been observed that iron (Fe) may become oxidized on the cathode, and $Fe^{3+}$ becomes reduced to $Fe^{2+}$, followed by the Fe on both the cathode and the anode. As such, an Fe bridge forms during cycling, resulting in a short.

FIGS. 5C and 5D illustrate a failure during an over-discharge condition, where it can be seen that the end temperature rises considerably with the cycle number. At the end of the over-discharge, a sharp temperature rise can be observed, which typically accompanies a capacity decrease in the battery resulting from the internal short. Also, the anode potential may become very positive during over-discharge. Here, copper (Cu) foil becomes oxidized on the anode at the end of over-discharge due to the reversal of the anode potential. Cu becomes reduced for the cathode at the end of over-discharge, resulting in a Cu bridge (short) between the cathode and anode, resulting in failure. From the above, it can be surmised that, for cells operating under normal charge/discharge cycles, the cause of failure can usually be linked to the degradation of electrodes and electrolytes.

Turning back to FIG. 2, monitor system 202 may calculate the internal temperature of each of the i battery cells according to $T_{i,i} = T_{s,i} + \Delta T = h(I, T_s, SoC)$ at different I, $T_s$, and SoC Impedance $Z_i$ and temperature differential ($dT_{s,i}/dt$) may also be calculated in monitor system 202 at different I, $T_s$, and SoC as well. These calculations are then provided to processor 204 to determine if a battery fail condition may exist. Under one embodiment, processor 204 evaluates, for each cell, the temperature $T_{i,i}$ temperature differential $dT_{s,i}/dt$, and impedance $Z_i$ by comparing the measurements to a look-up table 205 according to a set of rules to determine failure(s) or if a failure is about to occur. Look-up table 205 preferably comprises values based on charge/discharge capacities (e.g., 0.1 C, 0.5 C, 1 C, 2 C, etc.) correlated with different temperatures (e.g., 0° C., 5° C., 10° C., 15° C., etc.). Processor 204 preferably weighs the severity of different failures based on temperature $T_{i,i}$, temperature differential $dT_{s,i}/dt$, and/or impedance $Z_i$, and if the comparison for any of these factors exceed a predetermined threshold, processor 204 transmits a warning signal for the cell and pack to a system controller, indicating a severity level or SoH.

When utilizing rule-based failure detection, a variety of rules may be implemented for detecting failure based on battery capacity and temperature. For example, a basic rule-based failure detection algorithm may be structured for 2 C over-discharge at room temperature (e.g., 23° C.). The rule for this example may be configured to take into account charging after an over-discharge, where (a) an unusual increase in temperature would indicate impending failure, and/or (b) an unusual decrease of voltage would indicate impending failure. Thus, for each time period, $T_{s,i}$, $V_i$, and $I_i$ would be captured in real-time. Next, a first rule ("Rule I") for the temperature could be defined by setting voltage and current parameters for each cell (e.g., $V_i < 2$ and $I_i \leq 0$). When either or both parameters are met, a local maximum cell surface temperature ($T_{s\_max}$) is initialized and the actual $T_{s,i}$ data is compared to the maximum($T_{s\_max}$). If $T_{s,i} > T_{s\_max} + \delta_T$, where $\delta_T$ is the temperature threshold, processor 204 may transmit a warning signal. A second rule ("Rule II") could be set for voltage decrease by determining if $I_i > 0$, a voltage determination, defined by $V_{i-k} - V_i > \beta_V$ would take place. Here, k is the period offset used to eliminate the influence of noise, while $\beta_V$ is the voltage threshold. If $V_{i-k} - V_i > \beta_V$ is met, processor 204 would transmit a warning signal.

Figure 6A:
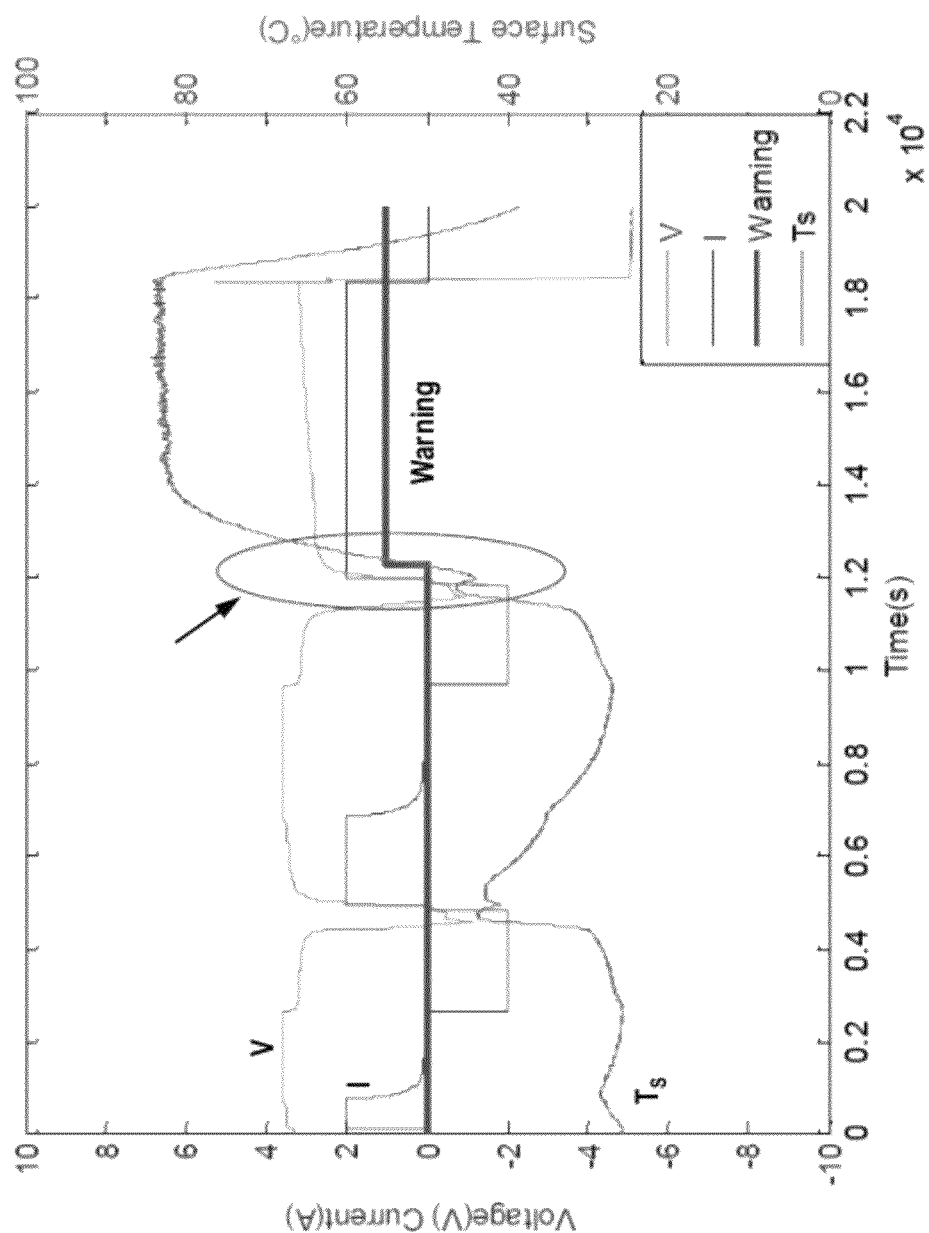
FIGS. 6A-6C are exemplary graphical illustration of battery failure conditions based on a plurality of rule-based determinations.
Figure 6B:
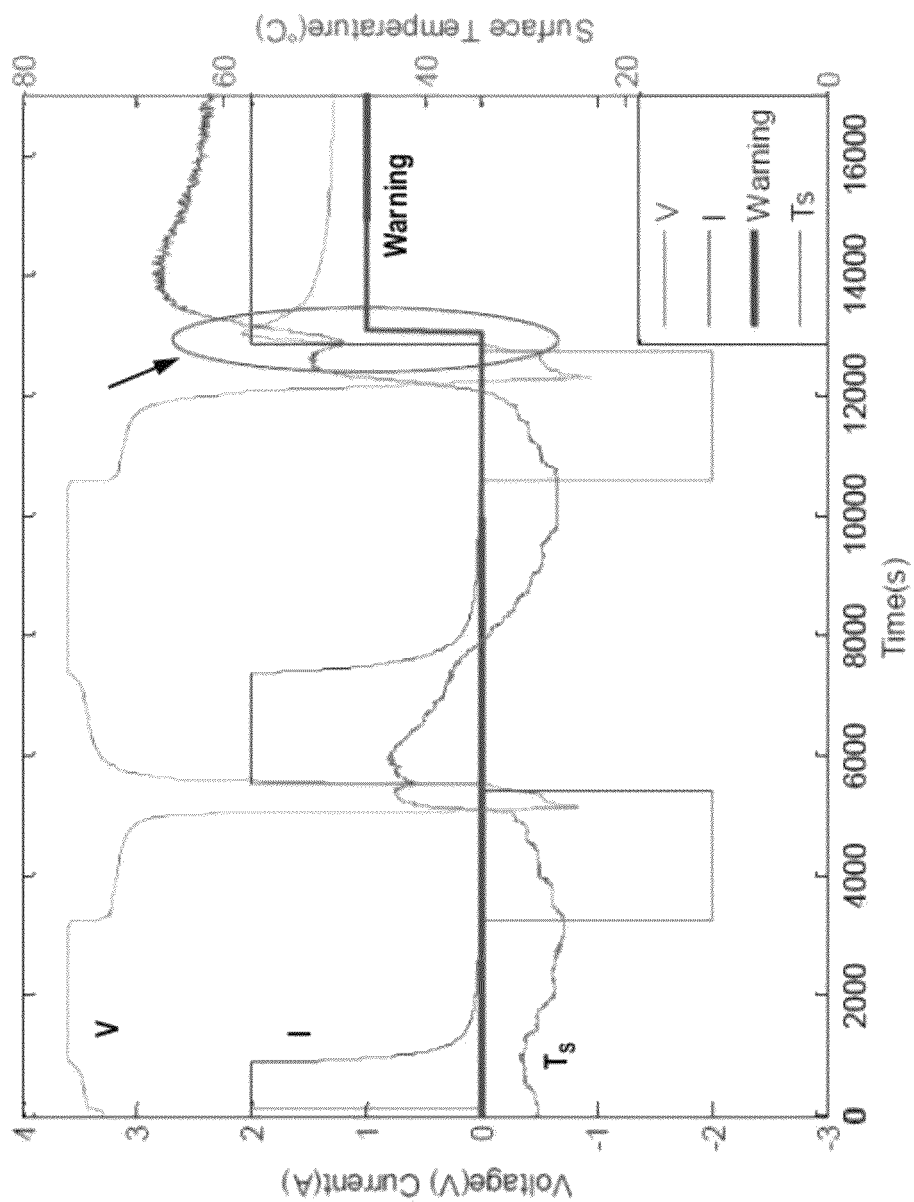
Figure 6C:
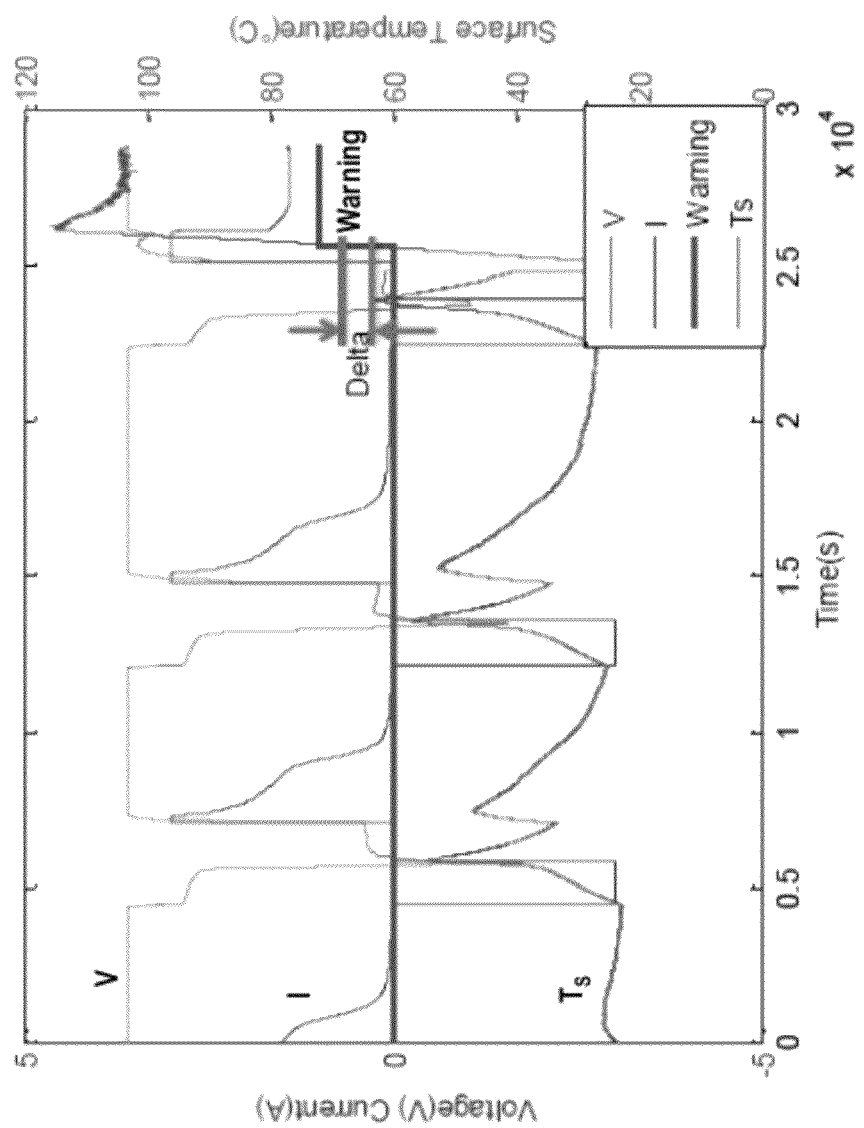

FIG. 6A provides a graphical illustration of the issuance of the warning signal for a 2 C overcharge according to Rule I, based on voltage (V), current (I) and temperature ($T_s$) over time. As can be seen from the figure, when the voltage drops below 2, the current is less than or equal to 1, and the temperature exceeds the given threshold, the warning signal is triggered. FIG. 6B provides a graphical illustration of the issuance of a warning signal for a 2 C overcharge according to Rule II, based on voltage (V), current (I) and temperature ($T_s$) over time. As can be seen from the figure, as $I_i > 0$ and voltage threshold are reached, the warning signal is triggered. FIG. 6C is a graphical illustration of voltage (V), current (I) and temperature ($T_s$) according to Rule I, except that a 3 C over-discharge basis is used for triggering the warning signal.

Figure 3:
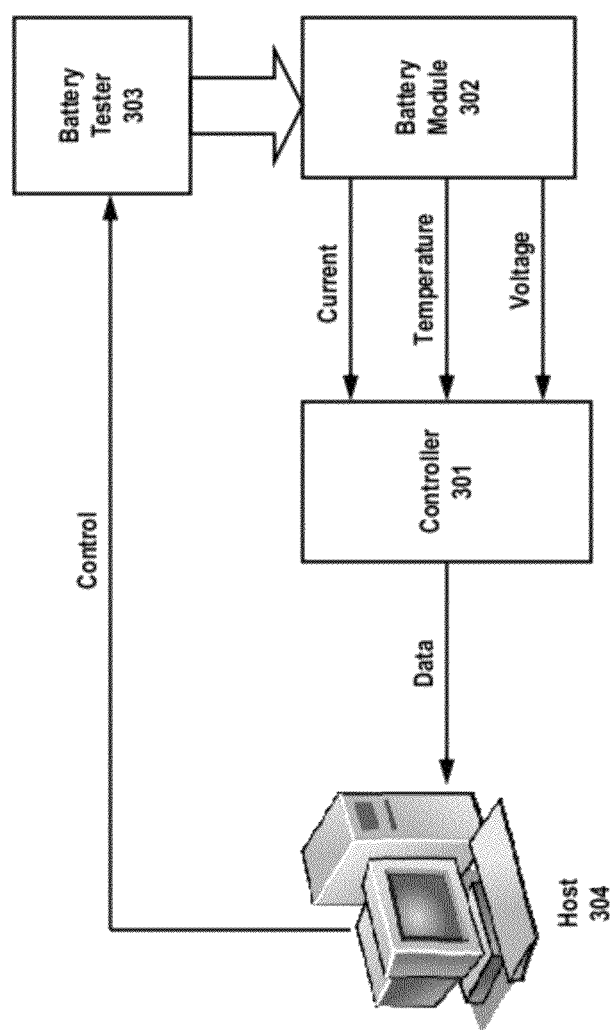
FIG. 3 illustrates an exemplary system configuration for detecting and/or predicting a failure condition in at least one of a plurality of batteries.

Turning to FIG. 3, an exemplary configuration is provided for testing batteries to determine battery characteristics used to set failure profiles for different types of batteries. The failure profile may include threshold values based on voltage, current, impedance and temperature. Threshold values set from the system in FIG. 3 may then be used for triggering warning signals on other systems, discussed above. Of course, it is understood that the battery testing, measurement and transmission of warning signals may all take place within the system of FIG. 3 as well.

Battery tester 303 is used to hold the battery cells from battery module 302 and provide test data to controller 302. A suitable battery tester for this purpose includes Arbin BT2000 Battery Testing System, which is a multiple independent-channel testing system, where each channel operates independently of the others, enabling users to run tests on multiple batteries at the same time. Battery tester 303 may be used to generate battery charging and discharging cycles in order to provide current temperature and voltage measurements to controller 301. Under one embodiment, controller 301 comprises a control rack operatively coupled to a controller that provides data communication to host computer 304. Host computer may provide control and/or warning signals back to battery tester 303. An exemplary controller suitable for operation in FIG. 3 includes National Instruments CompactRIO reconfigurable embedded control and acquisition system, whose architecture includes I/O modules, a reconfigurable field-programmable gate array (FPGA) chassis, and an embedded controller. Additionally, CompactRIO is may be programmed with NI LabVIEW graphical programming tools (via host 304) to provide further embedded control and monitoring applications, if needed. Additional peripherals suitable for battery measurements in controller 301 may include NI 9213 16-channel thermocouple input module for temperature measurements, NI 9206 16-Ch, 16-bit, analog input module, and NI 9227 4-channel current input "C Series" module. It is understood by those skilled in the art that other or additional peripherals and devices may be used for battery measurement and control without deviating from the scope of the present disclosure.

Depending on the type of measurements being taken, different models may be used for calculating impedance (discussed above in connection with FIGS. 1 and 2) or internal battery temperature for failure condition analysis. Turning to FIG. 4A, an exemplary model circuit is disclosed for employing electrochemical impedance spectroscopy (EIS) to determine model structure and parameters of a battery. In accordance with this model, it is presumed that all battery failures may be traced to characteristics and structures contained in a battery (e.g., cathode, anode, separator, electrolyte, can/terminal, safety vents, etc.). Under normal cycle, it has been found that capacitance slowly decays, and internal impedance rises as the cycle number increases. Additionally, the temperature of end discharge increases with the cycle number.

Each battery may be modeled as having a high-frequency inductance (L) set in series with the ohmic resistance from an electrode, electrolyte, separator and connection. This resistance ($R_0$) may represent the internal resistance of the battery, including the separator resistance and all the contact resistance. The Solid Electrolyte Interface (SEI) layer of the battery is important for the stability of secondary cells in the battery, and typically employs carbon anodes. The electrolyte reacts with the carbon anode during the initial formation charge and a thin passivating SEI layer builds up moderating the charge rate and restricting current. The SEI layer may also increase the cell internal impedance and reduce the possible charge rates as well as the high and low temperature performance. Excessive heat can cause the protective SEI barrier layer to beak down allowing the anode reaction to restart releasing more heat leading to thermal runaway. The thickness of the SEI layer is not homogeneous and increases with age, increasing the cell internal impedance, reducing its capacity and hence its cycle life.

The capacitance $C_{sei}$ and resistance $R_{sei}$ of the SEI layer is taken into consideration in the model as shown in FIG. 4A. While not expressly shown, the capacitance of the interface between the SEI layer and mesocarbon microbead (MCMB) may also be used. Additionally, the double-layer capacitance $C_{dl}$ and charge-transfer resistance $R_{ct}$ is included in the exemplary circuit model, where charge-transfer resistance $R_{ct}$ is set in parallel to the double-layer capacitance $C_{dl}$, together with the battery's Warburg diffusion impedance $W_d$, shown in FIG. 4A. Typically, charge transfer resistance $R_{ct}$ is smaller than $R_{sei}$, where Li$^+$+MCMB$\leftrightarrows$Li+MCMB. Accordingly, the model of FIG. 4A may be expressed as $R_0(C_{sei}R_{sei})(C_{dl}(R_{ct}W_d))$. It is understood by those skilled in the art that other models similar to FIG. 4A may be used without deviating from the scope of the present disclosure.

For modeling temperature to determine and/or predict battery failure, surface temperature, current, and voltage of the battery while it is being both charged and discharged may be monitored. The presently disclosed system is capable algorithmically monitoring any of such characteristics and output an internal temperature. One technique for determining internal temperature involves the use of Fourier's Law under given constants, including the thermal resistances of the various materials and the heat generation at different currents. In the case of lithium ion batteries, they make good power storage devices, however they offer significant risks in certain situations. When a battery is over-charged or over-discharged, it produces significant heat. If the battery isn't properly monitored, there is the possibility of an explosion. It was discovered that one of the better ways to predict danger is through observation of the internal temperature. The surface temperature can be measured and the heat generation can be calculated using thermal resistance; knowing the thermal resistance of the battery is advantageous to understanding how the battery behaves while it charges and discharges.

In order to accurately find the thermal resistance of a battery, the path of the heat needs to be considered. A battery typically comprises multiple sheets wrapped into a spiral and pressed into a casing. These layers consist of the anode, cathode, and two separator layers. The heat has the option of passing through the layers radially, or it can follow them tangentially. The anode and cathode are sheets of low resistance metals coated with relatively high resistance substances. This causes the majority of the heat to travel through the metal around the battery rather then passing through the coating.

FIG. 4B illustrates an exemplary analytical thermal system model, that is generally governed by $\Delta T = T_s - T_i = (q_{chem} + q_{elec})R_{tot}$, where $T_s$ is the battery surface temperature, $T_i$ is the battery internal temperature, $q_{chem}$ is the heat flux due to ohmic heat, $q_{elec}$ is the heat flux due to all other heat sources that are determined analytically or experimentally, and $R_{tot}$ is the total thermal resistance of a cell. In general terms, $q_{elec}$ may be expressed as $q_{elec} = VI$ while $q_{chem}$ may be expressed as $q_{chem} = f(I, V, T_{am}, SoC_t)$, where $T_{am}$ represents ambient temperature and $SoC_t$ represents a state-of-charge for a given time.

Current is provided to integrator 403 where a state-of-charge (SoC) or depth-of-discharge (DoD) may be calculated. The SoC/DoD is provided to heat flux $q_{elec}$ calculation module 401 and ohmic heat flux $q_{chem}$ calculation module 404. The heat flux $q_{elec}$ calculation module 401 also receives as an input voltage (V) and temperature $T_a$. Using the voltage, current and SoC/DoD from 403, module 401 processes the values using an open-circuit potential curve 402 to determine $q_{elec}$. The open circuit (OC) potential may be regarded as the potential of the working electrode relative to a reference electrode when no potential or current is being applied to a cell. Generally, when a potential is applied relative to OC, the system measures the open circuit potential before turning on the cell, then applies the potential relative to that measurement.

The ohmic heat flux $q_{chem}$ module also receives current (I), SoC/DoD from integrator 403, and further receives $q_{chem}$/I Curve from 406 to perform curve fitting for that calculation of $q_{chem}$. Curve 406 generally relates to a temperature-DoD curve, illustrated in FIG. 4B. While the thermal model is a function of several factors ($\Delta T = T_s - T_i = (q_{chem} + q_{elec})R_{tot}$), internal temperature $T_i$ is of particular interest. Using measured surface temperature $T_s$, $R_{tot}$ may be calculated using already calculated $q_{elec}$ provide by 401. If $q_{chem}$ is known to be an equation, $T_i$ may be calculated using the thermal model. However, a $q_{chem}$ is typically a complex function, and may be difficult to calculate. Therefore, the curve fitting of 405 may be advantageously applied by using measured data from temperature-DoD, and fit the curve with knowing $T_i$ to get $q_{chem}$. Once calculated, $q_{chem}$ is summed with $q_{elec}$ to provide overall heating $q_{heating}$. Using a thermal resistance $R_{th}$ value, module 406 calculates a delta for the temperature ($\Delta T$). The $\Delta T$ value is then summed with a battery surface temperature $T_s$ to provide an internal battery temperature $T_i$ which may be used to detect and/or predict battery failure.

As can be appreciated from those skilled in the art, temperature is not the only parameter associated with failure. Generally speaking, "failure" as used herein may be defined as the inability of taking charges or delivering charges. In other words, a cell cannot be charged or discharged. The causes for failure in the LiFePO4 cells may be attributed to overcharge conditions, and cell failure is due to an internal short caused by micro-shorting from the formation of an iron bridge. During over-discharge conditions, the micro-shorting is from the formation of a copper bridge, discussed above.

Other parameters of cells such as voltage (V), state of charge (SoC), internal temperature ($T_i$), cell surface temperature differential ($dT_s/dt$), and AC impedance ($Z_i$) can also serve as parameters for monitoring the state of health and detecting the failure of a cell. Profiles for SoC, voltage, and AC impedance may also be modeled to determine failure. However, the use of a parameter as a failure indicator depends on whether the parameter is easily measured or computed, the response is fast enough, and the accuracy is high enough. The detection algorithm using temperature as the failure signature has been successfully developed and validated.

AC impedance may also be used to detect failure on both single cell and battery pack with multiple cells. Using an LIB cell equivalent circuit model (FIG. 4A), the measured AC impedance can be de-convoluted into different components such as the resistance ($R_{SEI}$) and the capacitance ($C_{SEI}$) of solid electrolyte interface (SEI), double layer capacitance ($C_{dl}$), and charge transfer resistance ($R_{ct}$), which corresponds to different physical processes in a LIB cell during charge/discharge. AC impedance may provide comprehensive information about the LIB cell, and it can be used as an effective technique for monitoring the state of health and detecting the incoming failure of LIB cells, modules, and packs. Each LIB cell or battery module in a battery pack typically has voltage leads to measure the voltage of the cell or module. Hence, the cell/module voltage is easy to measure, and the voltage can be used as a parameter for failure detection.

While at least one example embodiment has been presented in the foregoing detailed description, it should be appreciated that a vast number of variations exist. It should also be appreciated that the example embodiment or embodiments described herein are not intended to limit the scope, applicability, or configuration of the invention in any way. Rather, the foregoing detailed description will provide those skilled in the art with a convenient and edifying road map for implementing the described embodiment or embodiments. It should be understood that various changes can be made in the function and arrangement of elements without departing from the scope of the invention and the legal equivalents thereof.

What is claimed is:

1. A method for monitoring a battery using a processor-based system, comprising the steps of:
    receiving a temperature value measured from the battery in the system;
    receiving a temperature differential value from the battery in the system;
    receiving a state-of-charge (SoC) value measured from the battery in the system;
    processing at least one of the (a) temperature value and (b) temperature differential value, together with the SoC value to determine if the battery is approaching a failure condition prior to an actual failure condition, the failure condition comprising a battery short resulting from one of an overcharge condition and an overdischarge condition; and
    transmitting a warning signal if the processing step determined that a failure condition is approaching.

2. The method of claim 1, wherein the processing step comprises
    loading a look-up table into the system and comparing the measured temperature differential value to one or more values in the look-up table,
    wherein the look-up table comprises at least one of charge and discharge capacities over a plurality of different temperatures.

3. The method of claim 1, further comprising:
    receiving an impedance value measured from the battery in the system and comparing the measured impedance value to one or more values in a look-up table, wherein the look-up table comprises at least one of charge and discharge capacities over a plurality of different temperatures.

4. The method of claim 1, wherein the processing step comprises loading a rule into the system, wherein the rule comprises predetermined temperature threshold values for a given voltage and a given current, and wherein an approaching battery failure condition is determined if the temperature value exceeds the predetermined temperature threshold value.

5. The method of claim 1, further comprising
    receiving a voltage value measured from the battery in the system; and
    loading a rule into the system for the processing step, wherein the rule comprises predetermined voltage threshold values for a given voltage and a given current, and wherein an approaching battery failure condition is determined if the voltage value exceeds the predetermined voltage threshold value.

6. The method of claim 1, wherein the processing step comprises loading a temperature model into the system, and wherein an approaching battery failure condition is determined if the temperature value is outside one or more parameters of the temperature model.

7. The method of claim 6, wherein the temperature model is defined by $\Delta T = T_S - T_i = (q_{chem} + q_{elec})R_{tot}$, where $T_S$ is the battery surface temperature, $T_i$ is the battery internal temperature, $q_{chem}$ is the heat flux due to ohmic heat, $q_{elec}$ is the heat flux due to all other heat sources, and $R_{tot}$ is the total thermal resistance of a cell.

* * * * *